(12) United States Patent
Yeh et al.

(10) Patent No.: US 12,495,525 B2
(45) Date of Patent: Dec. 9, 2025

(54) VAPOR CHAMBER LID AND MANUFACTURING METHOD THEREOF

(71) Applicant: Jentech Precision Industrial Co., LTD., Taoyuan (TW)

(72) Inventors: Chun-Ta Yeh, Taoyuan (TW); Chin-Hung Kuo, Taoyuan (TW); Po-Li Wang, Taoyuan (TW)

(73) Assignee: Jentech Precision Industrial Co., LTD., Taoyuan (TW)

( * ) Notice: Subject to any disclaimer, the term of this patent is extended or adjusted under 35 U.S.C. 154(b) by 199 days.

(21) Appl. No.: 18/045,469

(22) Filed: Oct. 11, 2022

(65) Prior Publication Data

US 2023/0171929 A1 Jun. 1, 2023

(30) Foreign Application Priority Data

Nov. 26, 2021 (TW) .................................. 110144280

(51) Int. Cl.
*F28D 15/02* (2006.01)
*H05K 7/20* (2006.01)

(52) U.S. Cl.
CPC ....... *H05K 7/2039* (2013.01); *F28D 15/0233* (2013.01)

(58) Field of Classification Search
CPC . H01L 23/427; F28D 15/0233; F28D 15/046; H05K 7/20336
See application file for complete search history.

(56) References Cited

U.S. PATENT DOCUMENTS

| 2011/0024892 | A1* | 2/2011 | Lin | ...... H01L 23/427 257/E23.098 |
| 2016/0095256 | A1* | 3/2016 | Chen | ...... H01L 23/427 165/80.3 |
| 2020/0056845 | A1 | 2/2020 | Zhou et al. | |
| 2021/0015005 | A1* | 1/2021 | Yu | ...... H05K 7/20309 |
| 2021/0289669 | A1* | 9/2021 | Yurchenko | ...... H05K 7/20409 |

FOREIGN PATENT DOCUMENTS

| CN | 111343838 A | 6/2020 |
| CN | 213426739 U | 6/2021 |
| TW | 201616943 A | 5/2016 |
| TW | 201617578 A | 5/2016 |
| TW | I701419 B | 8/2020 |
| TW | M614442 U | 7/2021 |
| TW | M625563 U | 4/2022 |

* cited by examiner

*Primary Examiner* — Eric S Ruppert
(74) *Attorney, Agent, or Firm* — CKC & Partners Co., LLC

(57) ABSTRACT

The present disclosure is related to a vapor chamber lid. The vapor chamber lid includes a base plate and a top plate. The base plate includes a plate body, a frame, a plurality of supporting pillars and a chip accommodating portion. The frame surrounds the plate body to define a cooling space. The cooling space is configured to accommodate a working fluid. The supporting pillars are located in the cooling space. The chip accommodating portion is located on the plate body of the base plate and is facing away from the cooling space. The top plate is located on the frame of the base plate to seal the cooling space. An external sidewall of the frame of the base plate is coplanar with an external sidewall of the top plate.

8 Claims, 11 Drawing Sheets

VAPOR CHAMBER LID AND MANUFACTURING METHOD THEREOF

RELATED APPLICATIONS

This application claims priority to Taiwan Application Serial Number 110144280, filed Nov. 26, 2021, which is herein incorporated by reference.

BACKGROUND

Field of Disclosure

The present disclosure relates to a vapor chamber lid and a manufacturing method of the vapor chamber lid.

Description of Related Art

As the functions of electrical products improve, the necessity of cooling for the processors of the electrical products becomes higher. Therefore, the application of a vapor chamber has become more and more common. However, a traditional vapor chamber sets the pipeline for filling the working fluid on one side of the main body, which causes a significant risk in the case of a rupture of the unprotected pipeline in addition to the possibility of leakage of the working fluid when the vapor chamber in the case of an accidental collision. Furthermore, as the shapes and features of processors in the electrical products changes, the appearance and the structure of the vapor chamber may need to change accordingly, or else the vapor chamber cannot fully cover the processor, which may cause the cooling function of the vapor chamber to have a reduced effect.

SUMMARY

One aspect of the present disclosure provides a vapor chamber lid.

According to one embodiment of the present disclosure, a vapor chamber lid includes a base plate and a top plate. The base plate includes a plate body, a frame, a plurality of supporting pillars and a chip accommodating portion. The frame surrounds the plate body to define a cooling space. The cooling space is configured to accommodate a working fluid. The supporting pillars are located in the cooling space. The chip accommodating portion is located on the plate body of the base plate and faces away from the cooling space. The top plate is located on the frame of the base plate to enclose the cooling space. An external sidewall of the frame of the base plate is coplanar with an external sidewall of the top plate.

In the present embodiment of the present disclosure, the external sidewall of the frame of the base plate has no pipeline communicating with the cooling space extended outward from the external sidewall.

In the present embodiment of the present disclosure, the external sidewall of the frame completely overlaps with the external sidewall of the top plate.

In the present embodiment of the present disclosure, a peripheral of the frame and a peripheral of the top plate have the same contour.

In another embodiment of the present disclosure, the frame has a stepped part, and the external sidewall of the frame is located between the external sidewall of the top plate and the stepped part of the frame.

In yet another embodiment of the present disclosure, the external sidewall of the frame of the base plate and the external sidewall of the top plate each have a cavity, in which the two cavities overlap with each other.

In the present embodiment of the present disclosure, the cavity of the frame of the base plate is located between two adjacent corners of the base plate, and the cavity of the top plate is located between two adjacent corners of the top plate.

In yet another embodiment of the present disclosure, in which the supporting pillars are separated from each other, and the frame surrounds the supporting pillars.

In yet another embodiment of the present disclosure, the supporting pillars, the plate body and the frame are integrally formed as a single piece.

In yet another embodiment of the present disclosure, the vapor chamber lid further includes a first structural plate and a second structural plate. The first structural plate is located in the cooling space. Bottom portions of the supporting pillars are surrounded by the first structural plate, the first structural plate includes a plurality of first capillary structures, and the first capillary structures face toward the top plate. The second structural plate is located in the cooling space. Top portions of the supporting pillars are surrounded by the second structural plate. The second structural plate includes a plurality of second capillary structure, and the second capillary structures face toward the plate body of the base plate.

One aspect of another embodiment of the present disclosure is directed to providing a manufacturing method of a vapor chamber lid.

According to one embodiment of the present disclosure, a manufacturing method of a vapor chamber lid includes: forming a base plate, in which the base plate includes a plate body, a frame and a plurality of supporting pillars, and the frame surrounds the supporting pillars to define a cooling space, and the cooling space is configured to accommodate a working fluid; forming a through hole that penetrates through the frame; disposing a top plate on the frame, in which an external sidewall of the frame of the base plate is coplanar with an external sidewall of the top plate; closing and compressing the through hole to enclose the cooling space; and forming a chip accommodating portion on the plate body of the base plate, in which the chip accommodating portion faces away from the cooling space.

In the present embodiment of the present disclosure, the through hole is compressed by resistance welding, ultrasonic welding or high-frequency welding.

In another embodiment of the present disclosure, the method further includes: disposing a pipeline communicated with the through hole and the cooling space on a side of the frame facing away from the cooling space; filling the working fluid into the cooling space through the through hole and the pipeline; and cutting off the pipeline.

In yet another embodiment of the present disclosure, the method further includes: forming a stepped part on the frame, such that the external sidewall of the frame is located between the external sidewall of the top plate and the stepped part of the frame.

In yet another embodiment of the present disclosure, in which forming the chip accommodating portion on the plate body of the base plate is performed by using chemical-mechanical planarization, milling, stamping or etching.

In yet another embodiment of the present disclosure, the method further includes: forming a cavity on each of the external sidewall of the frame of the base plate and on the external sidewall of the top plate, in which the two cavities completely overlap with each other.

In yet another embodiment of the present disclosure, the method further includes disposing a first structural plate, in which bottom portions of the supporting pillars are surrounded by the first structural plate, the first structural plate includes a plurality of capillary structures, and the capillary structures face toward the top plate; and disposing a second structural plate, in which the top portions of the supporting pillars are surrounded by the second structural plate, the second structural plate includes a plurality of capillary structures, and the capillary structures face toward the plate body of the base plate.

In the aforementioned embodiments of the present disclosure, the external sidewall of the frame of the base plate is coplanar with the external sidewall of the top plate, which means that there is no pipeline communicated with the cooling space extended outward from the frame of the base plate. Since there is no pipeline on the external sidewall of the frame of the base plate, this avoids the opportunity of the rupture of the unprotected pipeline at a collision, and lowers the risk of the leakage of the working fluid in the cooling space caused by the rupture of the pipeline.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
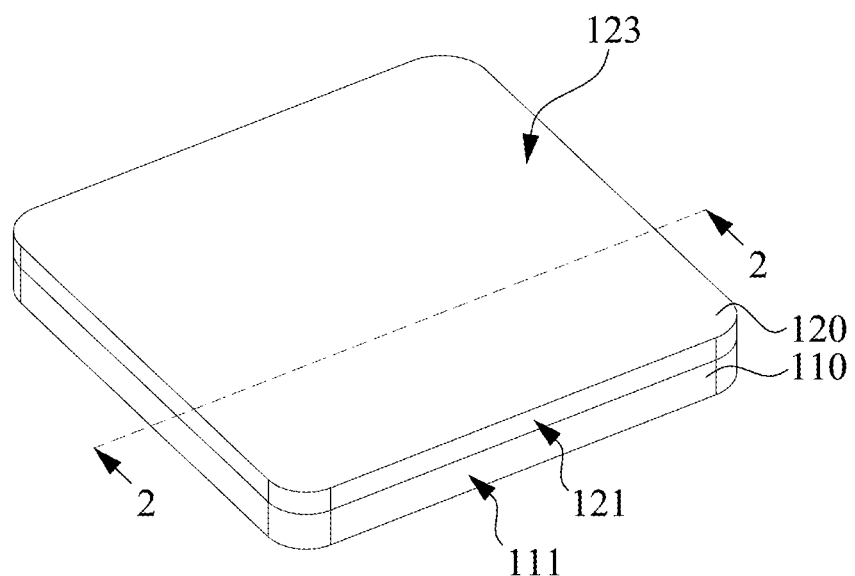
FIG. 1 is a perspective view of a vapor chamber lid according to one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
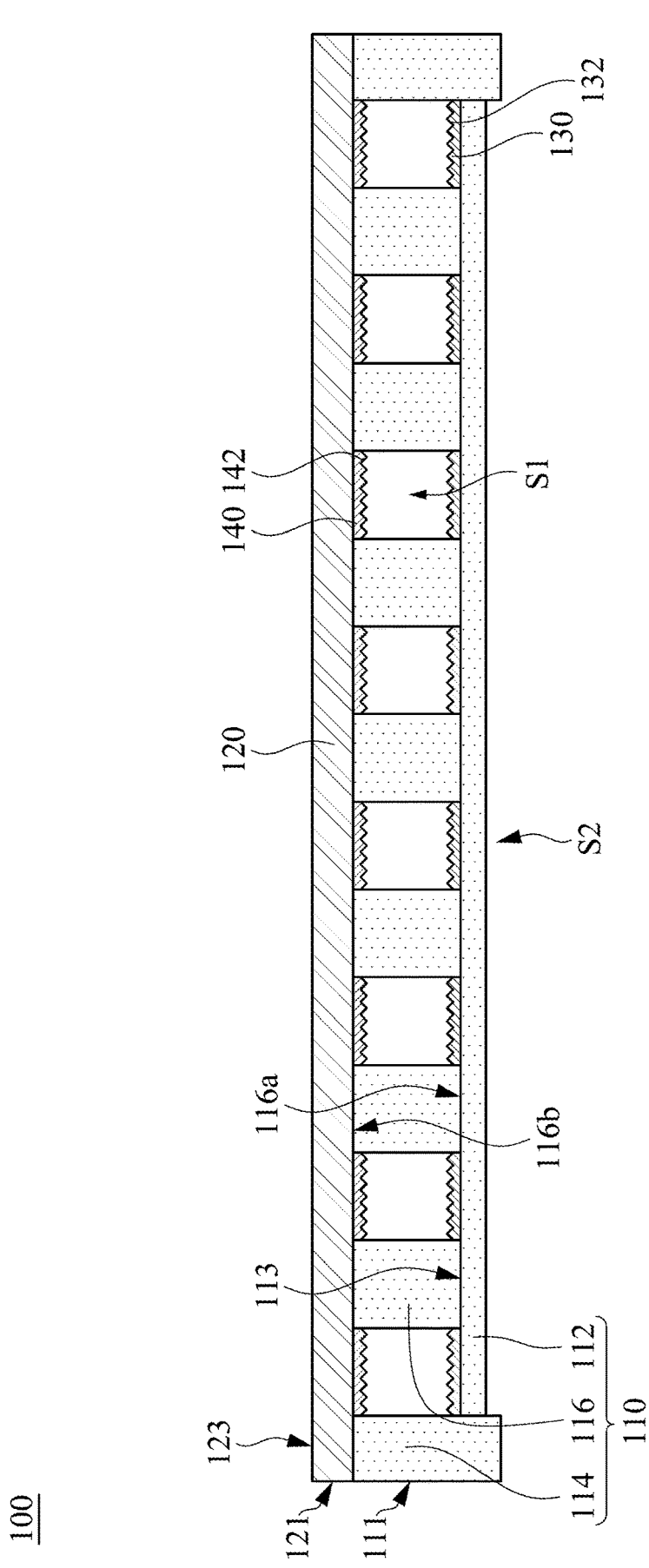
FIG. 2 is a cross-sectional view of the vapor chamber lid taken along line 2-2 of FIG. 1.

FIG. 1 is a perspective view of a vapor chamber lid 100 according to one embodiment of the present disclosure. FIG. 2 is a cross-sectional view of the vapor chamber lid 100 taken along line 2-2 of FIG. 1. Referring to FIG. 1 and FIG. 2, the vapor chamber lid 100 includes a base plate 110 and a top plate 120. The base plate includes a plate body 112, a frame 114, a plurality of supporting pillars 116 and a chip accommodating portion S2. The plate body 112 has a top surface 113 and a relatively bottom surface of the top surface 113. The frame 114 surrounds the plate body 112 and the supporting pillars 116 to define a cooling space S1. Furthermore, the bottom side of the frame 114 (The side that faces away from the top plate 120) can have an adhesive layer to glue the vapor chamber lid 100 on a base (not shown in the figures). The cooling space S1 is configured to accommodate a working fluid. For example, the working fluid can be water, but not restricted to it. The supporting pillars 116 are located in the cooling space S1 and are separated from each other. In some embodiments, the chip accommodating portion S2 is located on the plate body 112 of the base plate 110 and faces away the cooling space S2. S2 is configured to accommodate a chip (not shown in the figures) to take away the thermal energy the chip generates when the chip is operating. Furthermore, the appearance of the chip accommodation portion S2 can be customized according to different size and thickness of the chip to let the chip fully accommodated into the chip accommodation portion S2.

The top plate 120 is located on the frame 114 of the base plate 110 to enclose the cooling space S1. Noteworthy, the external sidewall 111 of the frame 114 of the base plate 110 is coplanar with the external sidewall 121 of the top plate 120. A peripheral of the frame 114 of the base plate 110 and a peripheral of the top plate 120 have the same contour. In this embodiment, the external sidewall 111 of the frame 114 of the base plate 110 has no pipeline communicated with the cooling space S1 and extended outward from the external sidewall 111, and the external sidewall 111 of the frame 114 of the base plate 110 completely overlaps with the external sidewall 121 of the top plate 120.

Specifically, since the external sidewall 111 of the frame 114 of the base plate 110 of the vapor chamber lid 110 is coplanar with the external sidewall 121 of the top plate 120, which means that there is no pipeline communicated with the cooling space extended outward from the frame of the base plate, therefore avoids the possibility of the rupture of the unprotected pipeline at a collision, and lower the risk of the leakage of the working fluid in the cooling space caused by the rupture of the pipeline. Furthermore, the supporting pillars 116, the frame 114 and the plate body 112 are integrally formed as a single piece, such that the base plate 110 has a good structural strength, so that when the vapor chamber lid 100 is operating, the probability of the vapor chamber lid 100 to be deformed or even damaged due to the effects of high temperature can be efficiently lowered, such that the operational performance and the working lifetime of the vapor chamber lid 100 can be efficiently improved.

Figure 3:
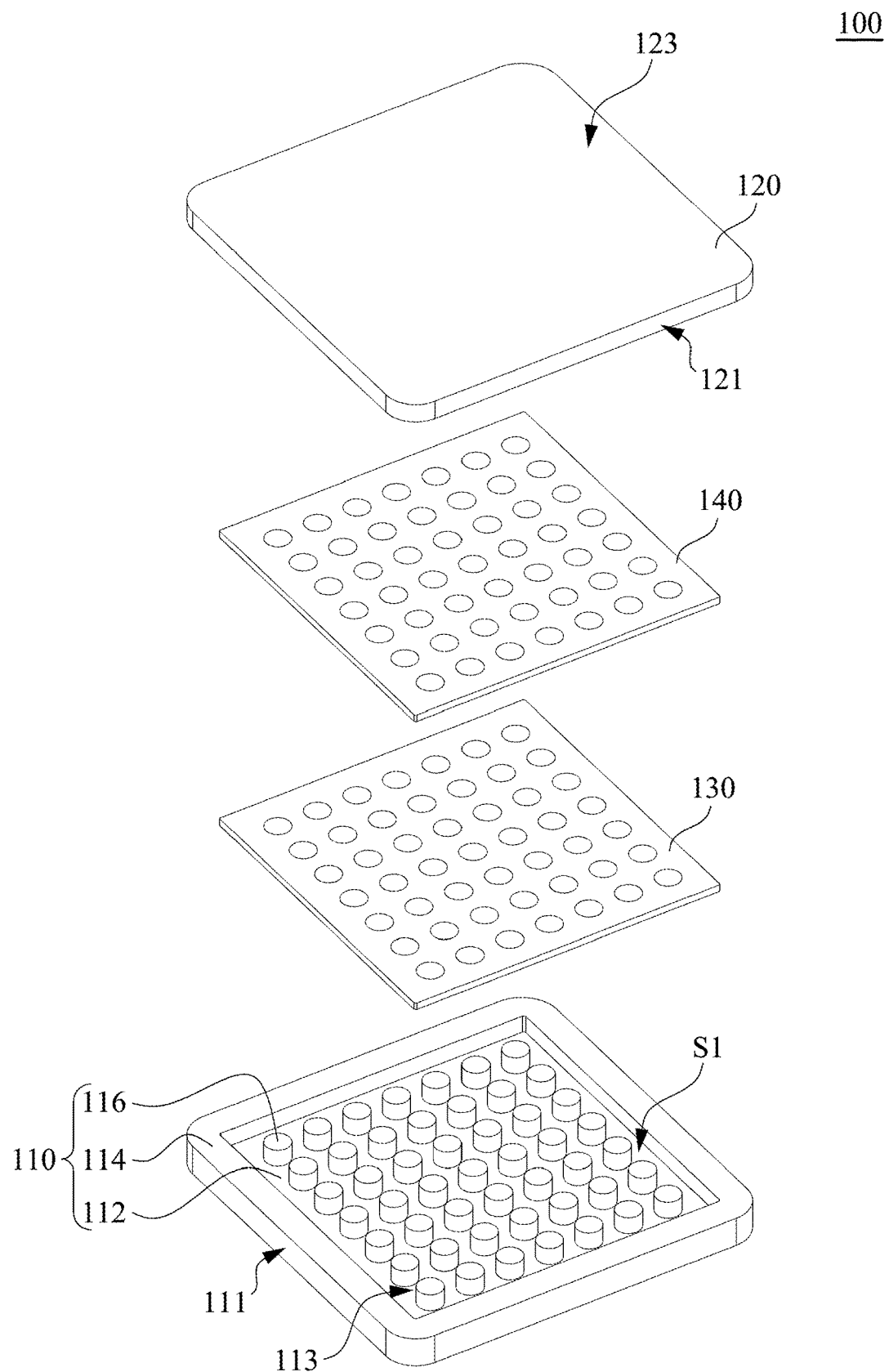
FIG. 3 is an exploded view of the vapor chamber lid of FIG. 1.

FIG. 3 is an exploded view of the vapor chamber lid 100 of FIG. 1. Referring to FIG. 3 and FIG. 2, the vapor chamber lid 100 also includes a first structural plate 130 and a second structural plate 140. The first structural plate 130 is located in the cooling space S1. The bottom portions 116a of the supporting pillars 116 are surrounded by the first structural plate 130. The first structural plate 130 includes a plurality of first capillary structures 132. The first capillary structures 132 faces toward the top plate 120. The second structural plate 140 is located in the cooling space S1. The top portions 116b of the supporting pillars 116 are surrounded by the second structural plate 140. The second structural plate 140 includes a plurality of second capillary structures 142. The second capillary structures 142 faces toward the plate body 112 of the base plate 110.

For real applications, the first capillary structures 132 of the first structural plate 130 and the second capillary structures 142 of the second structural plate 140 can be tiny protruding structures, hollow structures or mesh structures, but not restricted to the above mentioned. For example, when the vapor chamber lid 100 is operating, the working fluid accommodated in the cooling space S1 will change its phase by evaporating and condensing repeatedly and therefore provides a cooling effect. The first capillary structures 132 of the first structural plate 130 and the second capillary structures 142 of the second structural plate 140 is disposed to improve the efficiency of the evaporation and the condensation of the working fluid accommodated in the cooling space S1.

It is to be noted that the connection relationships, the materials, and the advantages of the elements described above will not be repeated in the following description. In the following description, other types of vapor chamber lid will be explained.

Figure 4A:
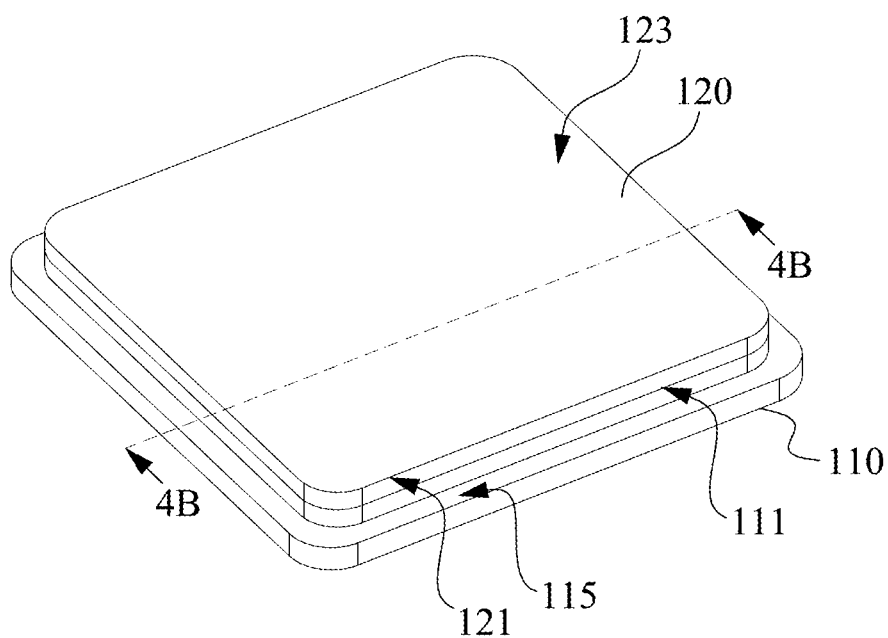
FIG. 4A is a perspective view of a vapor chamber lid according to another embodiment of the present disclosure.
Figure 4B:
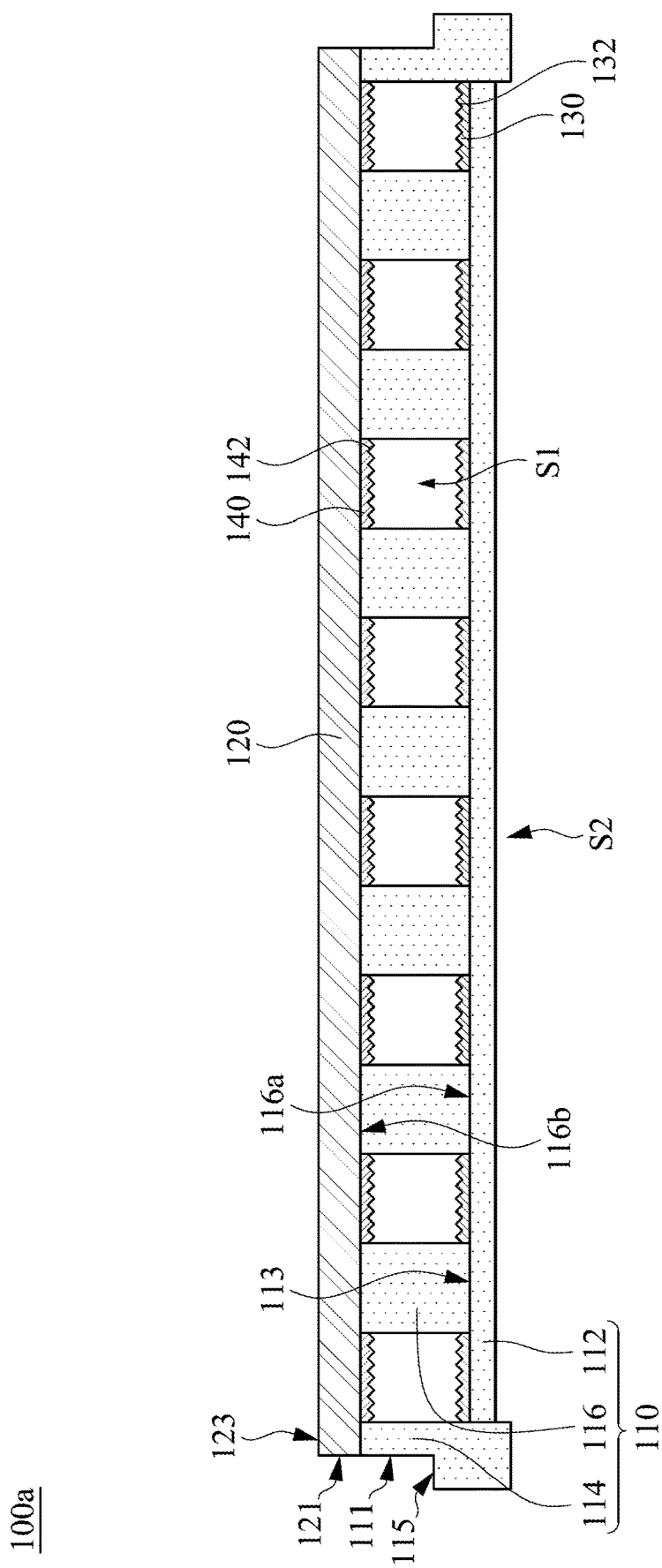
FIG. 4B is a cross-sectional view of the vapor chamber lid taken along line 4B-4B of FIG. 4A.

FIG. 4A is a perspective view of a vapor chamber lid 100a according to another embodiment of the present disclosure. FIG. 4B is a cross-sectional view of the vapor chamber lid 100a taken along line 4B-4B of FIG. 4A. Referring to FIG. 4A and FIG. 4B, the chip accommodation portion S2 is located on the plate body 112 of the base plate 110 of the vapor chamber lid 100a, in which the chip accommodation portion S2 faces away the cooling space S1. The chip accommodation portion S2 can take away thermal energy the chip generates when the chip is operating. The difference between the embodiment FIG. 4A shows and the embodiment FIG. 1 shows is that the frame 114 of the base plate 110 of the vapor chamber lid 100a has a stepped part 115. The external sidewall 111 of the frame 114 of the base plate 110 is located between the external sidewall 121 of the top plate 120 and the stepped part 115 of the frame 114. For example, the stepped part 115 of the frame 114 of the base plate 110 of the vapor chamber lid 100a can meet with an engaging structure (not shown in the figures) to provide a fastening effect.

Figure 5:
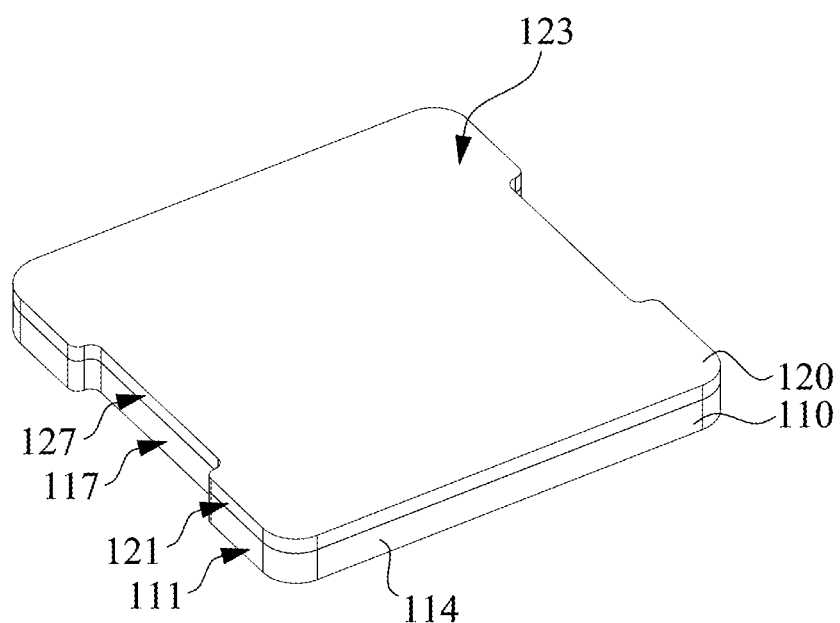
FIG. 5 is a perspective view of a vapor chamber lid according to still another embodiment of the present disclosure.

FIG. 5 is a perspective view of a vapor chamber lid 100b according to yet another embodiment of the present disclosure. A chip accommodation portion S2 as shown in FIG. 2 can be located on the base plate 110 although not shown in the figure. The chip accommodation portion S2 can take away thermal energy the chip generates when the chip is operating. The difference between this embodiment and the embodiment shown in FIG. 1 is that the external sidewall 111 of the frame 114 of the base plate 110 of the vapor chamber lid 100b and the external sidewall 121 of the top plate 120 of the vapor chamber lid 100b has a cavity 117 and a cavity 127 respectively. The cavity 117 of the frame 114 of the base plate 110 overlaps with the cavity 127 of the top plate 120. The cavity 117 of the frame 114 of the base plate 110 is located between the two adjacent corners of the base plate 110. The cavity 127 of the top plate 120 is located between the two adjacent corners of the top plate 120.

In the following description, a manufacturing method of a vapor chamber lid is described.

Figure 6:
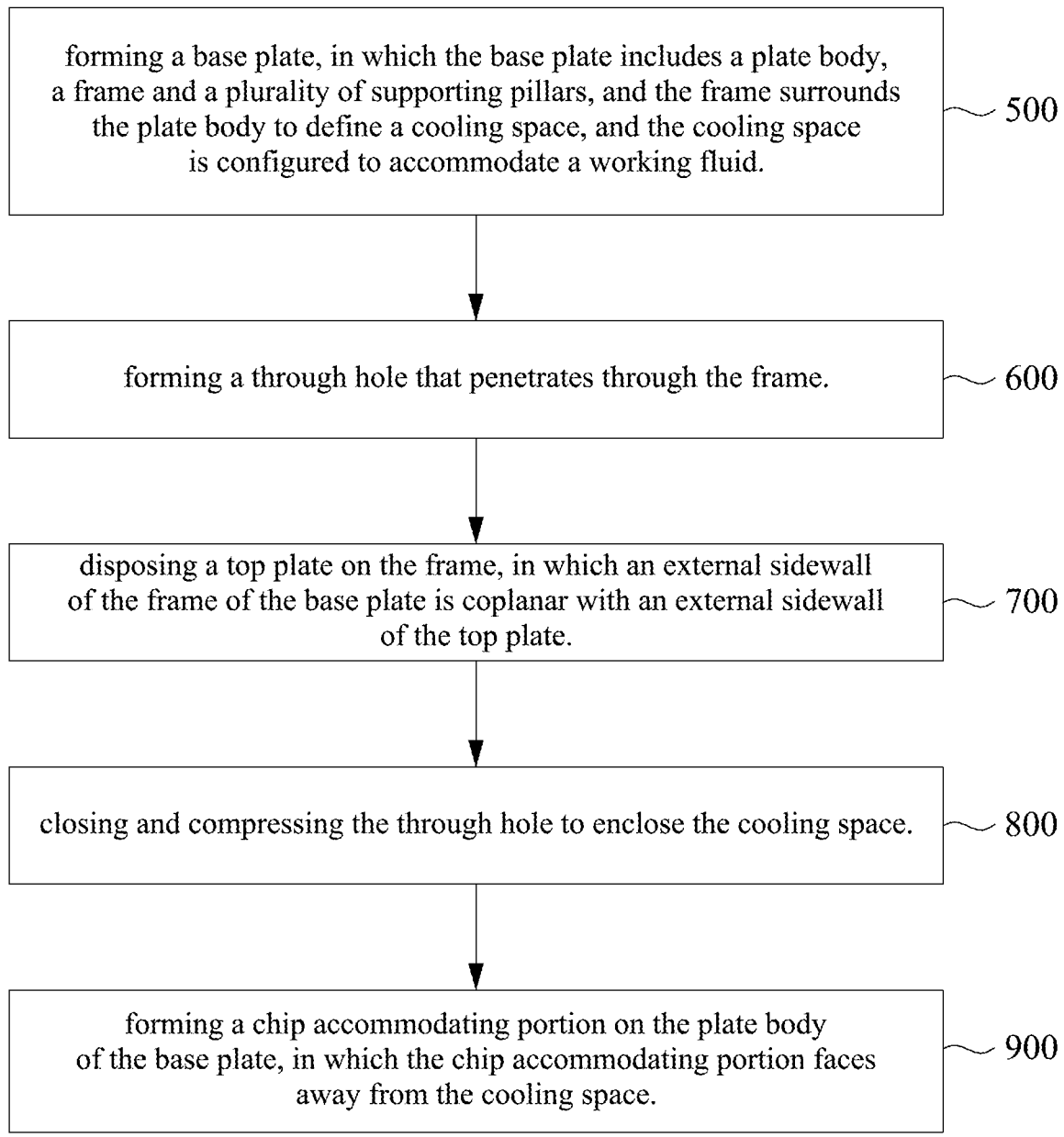
FIG. 6 is a flow chart of a manufacturing method of a vapor chamber lid according to one embodiment of the present disclosure.

FIG. 6 is a flow chart of a manufacturing method of a vapor chamber lid according to one embodiment of the present disclosure. The manufacturing method of a vapor chamber lid includes the following steps. In step 500, a base plate is formed, in which the base plate includes a plate body, a frame and a plurality of supporting pillars, and the frame surrounds the plate body to define a cooling space, and the cooling space is configured to accommodate a working fluid. Followed by step 600, a through hole that penetrates through the frame is formed. Followed by step 700, a top plate is disposed on the frame, in which an external sidewall of the frame of the base plate is coplanar with an external sidewall of the top plate. Then in step 800, the through hole is closed and compressed to enclose the cooling space. Followed by step 900, a chip accommodating portion is formed on the plate body of the base plate, in which the chip accommodating portion faces away from the cooling space. In the following description, the details of the steps mentioned above are described.

Figure 7:
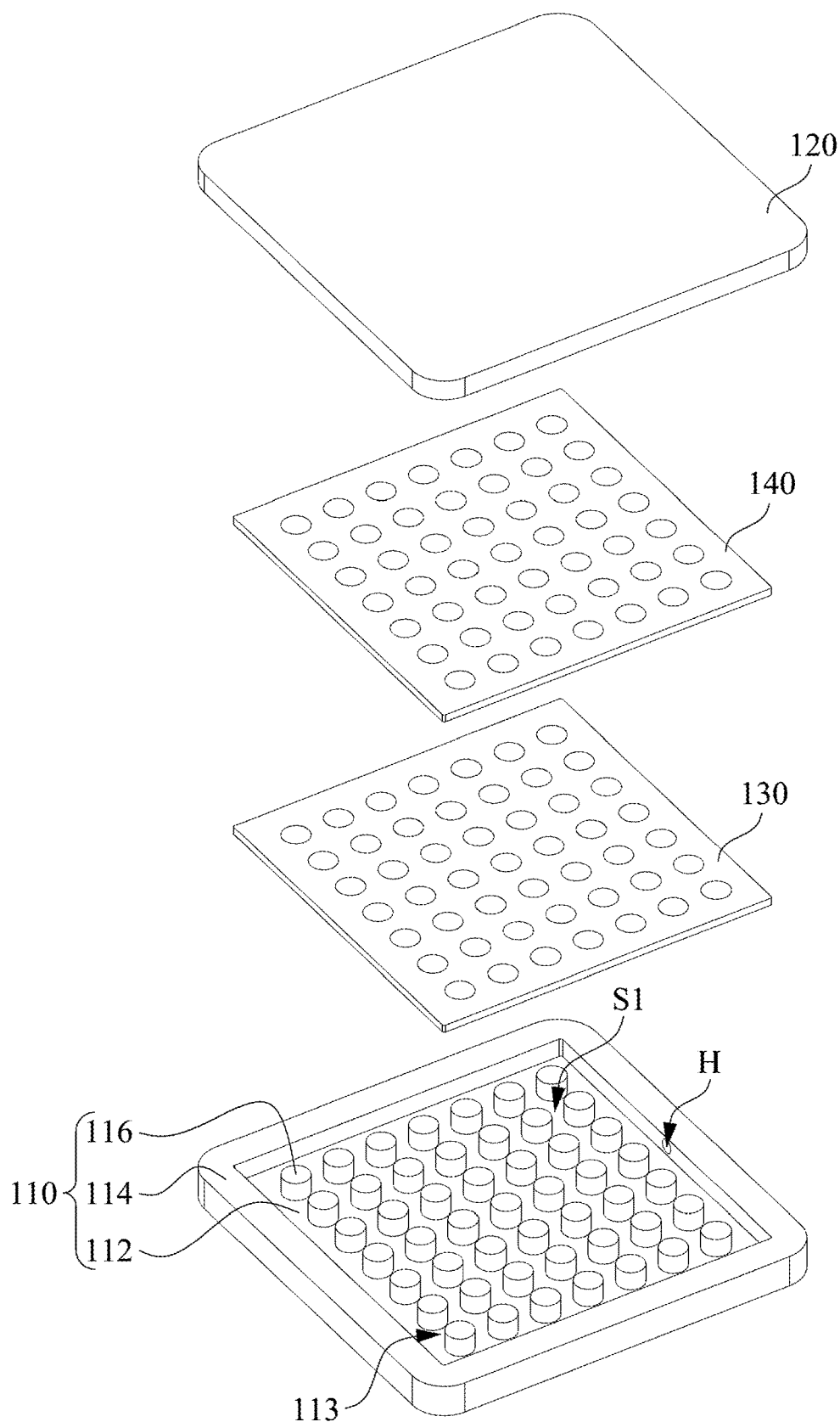
FIG. 7 is a schematic view in which a base plate is not assembled to a top plate according to one embodiment of the present disclosure.
Figure 8:
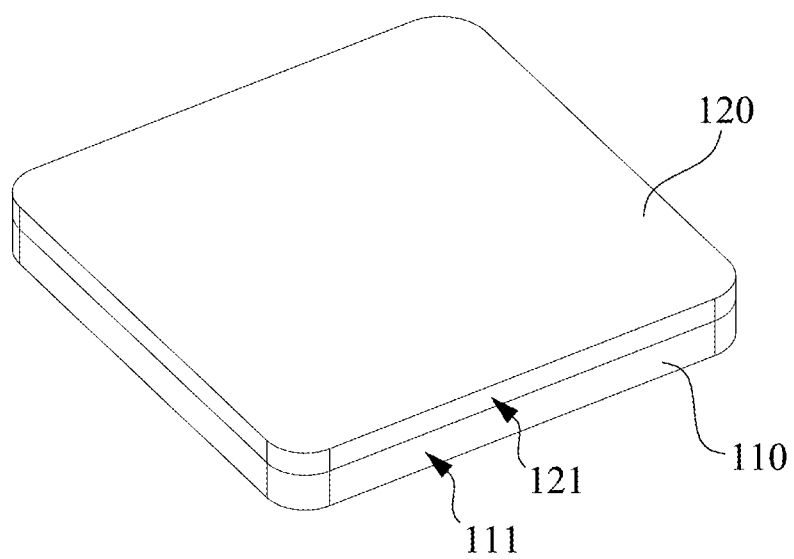
FIG. 8 is a schematic view in which the base plate is assembled with the top plate of FIG. 7.

FIG. 7 is a schematic view in which a base plate 110 is not assembled to a top plate 120 according to one embodiment of the present disclosure. FIG. 8 is a schematic view in which the base plate is assembled with the top plate of FIG. 7. Referring to FIG. 7 and FIG. 8, forming a base plate 110, in which the base plate 110 includes a plate body 112, a frame 114 and a plurality of supporting pillars 116, and the frame 114 surrounds the plate body 112 to define a cooling space S1, and the cooling space S1 is configured to accommodate a working fluid. For example, the working fluid can be water, but not restricted to it. In this embodiment, the supporting pillars 116, the frame 114 and the plate body 112 is integrally formed as a single piece, such that the base plate 110 has a good structural strength, so that when the vapor chamber lid 110 is operating, the probability of the vapor chamber lid 100 to deform or even damaged due to heating can be efficiently lowered, such that the operational performance and the working lifetime of the vapor chamber lid 100 can be efficiently improved. After forming the base plate 110, form a through hole H that penetrates through the frame 114 on the frame 114 of the base plate 110.

Next, referring to FIG. 2, FIG. 7 and FIG. 8, the manufacturing method further includes: disposing a first structural plate 130, in which the bottom portions 116a of the supporting pillars 116 are surrounded by the first structural plate 130. The first structural plate 130 includes a plurality of first capillary structures 132. The first capillary structures 132 faces toward the top plate 120; and a second structural plate 140 is disposed, in which the top portions 116b of the supporting pillars 116 are surrounded by the second structural plate 140. The second structural plate 140 includes a plurality of second capillary structures 142. The second capillary structures 142 faces toward the plate body 112 of the base plate 110.

Next, a top plate 120 on the frame 114 is disposed to enclose the cooling space S1 to form the structure as shown in FIG. 8. Noteworthy, the external sidewall 111 of the frame 114 of the base plate 110 is coplanar with the external sidewall 121 of the top plate 120. A peripheral of the frame 114 and a peripheral of the top plate 120 have the same contour. The external sidewall 111 of the base plate 110 has no pipeline communicating with the cooling space S1 and extends outward from the external sidewall 111, and the external sidewall 111 of the frame 114 of the base plate 110 completely overlaps the external sidewall 121 of the top plate 120. Next, pumping the cooling space S1 into vacuum can be done through the through hole H, and fill the working fluid into the cooling space S1 through the through hole H. After filling the working fluid into the cooling space S1, close and compress the through hole H to enclose the cooling space S1. In this embodiment, the through hole H is compressed by resistance welding, ultrasonic welding or high-frequency welding.

Next, the manufacturing method further includes: forming a chip accommodating portion S2 on the plate body 112 of the base plate 110, in which the chip accommodating portion S2 faces away from the cooling space S1. For example, the chip accommodating portion S2 can be formed by using chemical-mechanical planarization, milling, stamping or etching. Furthermore, the chip accommodation portion S2 can be customized according to different size and thickness of the chip to let the chip fully accommodated into the chip accommodation portion S2.

Figure 9:
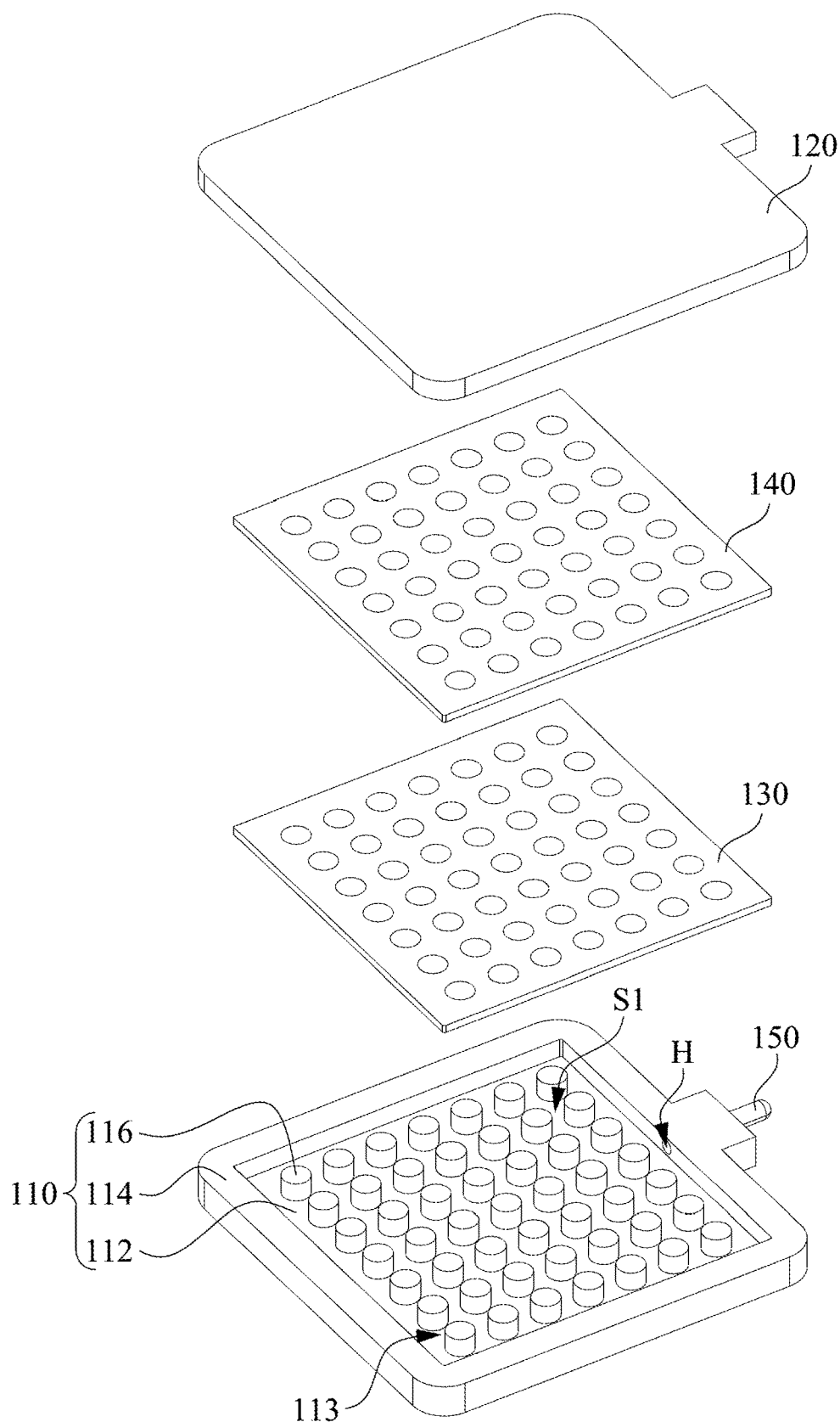
FIG. 9 is a schematic view in which a base plate is not assembled to a top plate according to another embodiment of the present disclosure.
Figure 10:
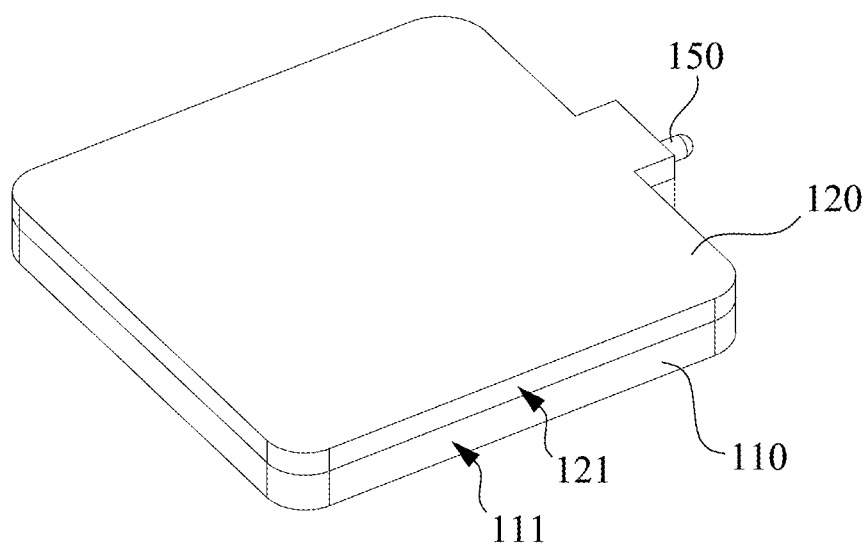
FIG. 10 is a schematic view in which the base plate is assembled with the top plate of FIG. 9.

FIG. 9 is a schematic view in which a base plate 110 is not assembled to a top plate 120 according to another embodiment of the present disclosure. FIG. 10 is a schematic view in which the base plate is assembled with the top plate of FIG. 9. Referring to FIG. 9 and FIG. 10, the difference between the embodiment shown in FIG. 9 and the embodiment shown in FIG. 8 is that the manufacturing method further includes disposing a pipeline 150 on a side of the frame 114 of the base plate 110 facing away from the cooling space S1. The pipeline 150 has a hole communicated with the through hole H and the cooling space S1. The hole is exposed outside the base plate 110. After disposing the pipeline 150, pumping the cooling space S1 into vacuum can be done through the hole of the pipeline 150, and fill the working fluid into the cooling space S1 through the pipeline 150 and the through hole H. After filling the working fluid into the cooling space S1, close and compress the through hole H to enclose the cooling space S1. After closing and compressing the through hole H, cut off the pipeline 150 and form the chip accommodation portion S2 as shown in FIG. 2 on the plate body 112 of the base plate 110. The chip accommodation portion S2 faces away from the cooling space S1.

Please refer to FIG. 4A and FIG. 4B, the manufacturing method further includes: forming a stepped part 115 on the frame 114 of the base plate 110, such that the external sidewall 111 of the frame 114 is located between the external sidewall 121 of the top plate 120 and the stepped part 115 of the frame 114, so that the vapor chamber lid 100a has a different appearance to the vapor chamber lid 100 as shown in FIG. 1. In detail, the frame 114 of the vapor chamber lid 110a has a stage difference, and the stepped part 115 of the frame 114 of the base plate 110 of the vapor chamber lid 100a can meet with an engaging structure (not shown in the figures) to provide a fastening effect.

Please refer to FIG. 5, the manufacturing method further includes: forming a cavity 117 on the external sidewall 111 of the frame 114 of the base plate 110 and a cavity 127 on the external sidewall 121 of the top plate 120 respectively. The cavity 117 of the frame 114 of the base plate 110 is located between the two adjacent corners of the base plate 110. The cavity 127 of the top plate 120 is located between the two adjacent corners of the top plate 120. The cavity 117 of the frame 114 of the base plate 110 overlaps with the cavity 127 of the top plate 120, so that the vapor chamber lid 100b has a different appearance to the vapor chamber lid 100 as shown in FIG. 1, to achieve a customization effect.

In summary, the external sidewall of the frame of the base plate is coplanar with the external sidewall of the top plate, which means that there is no pipeline communicated with the cooling space extended outward from the frame of the base plate. Since there is no pipeline on the external sidewall of the frame of the base plate, this avoids the opportunity of the rupture of the unprotected pipeline at a collision, and lowers the risk of the leakage of the working fluid in the cooling space caused by the rupture of the pipeline.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A vapor chamber lid, comprising:
   a base plate, comprising:
      a plate body;
      a frame surrounding the plate body to define a cooling space, the cooling space is configured to accommodate a working fluid;
      a plurality of supporting pillars located in the cooling space, wherein a height of one of the supporting pillars adjacent to the frame is the same as a height of one of the supporting pillars located on a central portion of the plate body, a lower surface of the frame is lower than a lower surface of the plate body adjacent to the frame, and a height of the frame is greater than a height of any one of the supporting pillars; and
      a chip accommodating portion located on the plate body and facing away from the cooling space; and
   a top plate located on the frame of the base plate to enclose the cooling space, wherein an external sidewall of the frame of the base plate is coplanar with an external sidewall of the top plate, and the frame has a portion laterally extending beyond the external sidewall of the top plate, a lower surface of said portion of the frame laterally extending beyond the external sidewall of the top plate is lower than the lower surface of the plate body, and the said portion of the frame has a rectangular cross-section and is disposed along the external sidewall of the top plate.

2. The vapor chamber lid of claim 1, wherein the external sidewall of the frame of the base plate has no pipeline communicated with the cooling space and extended outward from the external sidewall.

3. The vapor chamber lid of claim 1, wherein the external sidewall of the frame completely overlaps the external sidewall of the top plate.

4. The vapor chamber lid of claim 1, wherein a peripheral of the frame and a peripheral of the top plate have a same contour.

5. The vapor chamber lid of claim 1, wherein the frame has a stepped part, and the external sidewall of the frame is located between the external sidewall of the top plate and the stepped part of the frame.

6. The vapor chamber lid of claim 1, wherein the supporting pillars are separated from each other, and the frame surrounds the supporting pillars.

7. The vapor chamber lid of claim 1, wherein the supporting pillars, the plate body and the frame are integrally formed as a single piece.

8. The vapor chamber lid of claim 1, further comprising:
- a first structural plate located in the cooling space, wherein bottom portions of the supporting pillars are surrounded by the first structural plate, the first structural plate comprises a plurality of first capillary structures, and the first capillary structures face toward the top plate; and
- a second structural plate located in the cooling space, wherein top portions of the supporting pillars are surrounded by the second structural plate, the second structural plate comprises a plurality of second capillary structures, and the second capillary structures face toward the plate body of the base plate.

* * * * *